United States Patent
Bishop et al.

(10) Patent No.: US 7,003,028 B1
(45) Date of Patent: Feb. 21, 2006

(54) MIXED SIGNAL ADAPTIVE BOOST EQUALIZATION APPARATUS AND METHOD

(75) Inventors: Andrew Bishop, Shrewsbury, MA (US); Ivan Chan, Kanata (CA); Russell W. Brown, Nepean (CA)

(73) Assignee: Maxtor Corporation, Milpitas, CA (US)

( * ) Notice: Subject to any disclaimer, the term of this patent is extended or adjusted under 35 U.S.C. 154(b) by 907 days.

(21) Appl. No.: 09/650,964

(22) Filed: Aug. 29, 2000

(51) Int. Cl.
*H03H 7/30* (2006.01)

(52) U.S. Cl. ...................................... 375/232; 375/229
(58) Field of Classification Search ................ 375/229, 375/230, 231, 232, 233, 234, 235
See application file for complete search history.

(56) References Cited

U.S. PATENT DOCUMENTS

| | | | |
|---|---|---|---|
| 5,257,286 A * | 10/1993 | Ray ............................. | 375/12 |
| 5,689,528 A * | 11/1997 | Tsujimoto .................... | 375/233 |
| 5,894,468 A * | 4/1999 | Kimura et al. ................. | 360/46 |
| 5,991,339 A * | 11/1999 | Bazes et al. .................. | 375/232 |
| 6,002,717 A * | 12/1999 | Gaudet ......................... | 375/232 |
| 6,137,353 A * | 10/2000 | Stroet et al. .................. | 329/336 |
| 6,535,552 B1 * | 3/2003 | Pessoa ......................... | 375/231 |
| 6,601,007 B1 * | 7/2003 | Amir et al. ................... | 702/107 |
| 6,643,324 B1 * | 11/2003 | Gasparik ...................... | 375/229 |
| 6,778,599 B1 * | 8/2004 | Doron .......................... | 375/232 |

* cited by examiner

*Primary Examiner*—Young T. Tse
*Assistant Examiner*—Sam K. Ahn
(74) *Attorney, Agent, or Firm*—Myers Bigel Sibley & Sajovec, P.A.

(57) ABSTRACT

The high frequency components of a SCSI signal are adaptively equalized using an adaptive filter having an adjustable gain. A comparator is used to compare an input signal with a predetermined threshold level. Based on the result of the comparison, the adjustable gain of the adaptive filter is modified.

10 Claims, 8 Drawing Sheets

MIXED SIGNAL ADAPTIVE BOOST EQUALIZATION APPARATUS AND METHOD

BACKGROUND OF THE INVENTION

1. Field of the Invention

The present invention generally relates to high-speed binary communications. More specifically, the invention relates to a novel apparatus and method which reduces Inter-Symbol Interference (ISI) under variable cabling environments within the SCSI protocol.

2. Description of Related Art

Computers are generally constructed with at least one parallel data bus capable of transferring digital information between a host computer processor and hardware devices such as printers, scanners, disk drives, etc. FIG. 1 illustrates a parallel bus 100 connected to a host 120 and various hardware devices 140a . . . 140m. The number of hardware devices 140a . . . 140m that can communicate via parallel bus 100 is limited by the type of electronic interface, i.e., bus, used in the computer's design.

One well-known electronic interface that is employed in the architecture of computers is the Small Computer System Interface (SCSI). SCSI is a set of ever changing electronic interface standards that allow faster and more flexible parallel communication between computers and peripheral hardware over previous interfaces. The maximum length of cable that can comprise the bus as well as the maximum number of devices that can be connected to it is dictated by the specific SCSI standard employed within the computer. For example, the SCSI-1 standard specifies a bus that can be six meters in length and can interconnect up to eight devices. A list of the currently adopted SCSI standards and their main attributes are summarized in TABLE 1.

TABLE 1

| SCSI Standard | Maximum Cable Length (m) | Maximum Speed (Mbytes/sec) | Maximum Number of Devices |
| --- | --- | --- | --- |
| SCSI-1 | 6 | 5 | 8 |
| SCSI-2 | 6 | 5–10 | 8 or 16 |
| Fast SCSI-2 | 3 | 10–20 | 8 |
| Wide SCSI-2 | 3 | 20 | 16 |
| Fast Wide SCSI-2 | 3 | 20 | 16 |
| Ultra SCSI-3, 8-bit | 1.5 | 20 | 8 |
| Ultra SCSI-3, 16-bit | 1.5 | 40 | 16 |
| Ultra-2 SCSI | 12 | 40 | 8 |
| Wide Ultra-2 SCSI | 12 | 80 | 16 |
| Ultra-3 (Ultra160/m) SCSI | 12 | 160 | 16 |

SCSI interfaces are susceptible to the same signal distortion interference that is seen in most digital transmission devices. As data transmission speeds and cable lengths increase, signals transmitted using SCSI interfaces become vulnerable to inter-symbol interference (ISI), which, in a digital transmission system, is distortion of the received signal. This distortion is exhibited by temporal spreading and consequent overlap of individual pulses to the degree that the receiver cannot reliably distinguish between change of states, i.e., between individual signal elements.

Contributing factors leading to inter-symbol interference include timing inaccuracies between pulse timing and the channel ringing; insufficient bandwidth; amplitude distortion as a function of frequency; phase distortion as a function of frequency; variations in loading conditions as a function of the number of devices connected to the cable; and length of the cable.

Regardless of the circumstances responsible, inter-symbol interference results in unreliable data detection when messages are passed between two or more devices in a SCSI environment. In an effort to combat the effects of ISI, several conventional equalization approaches have been adopted. In one approach, equalization of the digital pulse signal is accomplished by utilizing a second order zero ($s^2$) in the frequency domain to narrow the pulse into a pre-defined target shape. Maximum likelihood detectors are then used to extract the relevant data. This approach reduces the amplitude distortion effect associated with ISI, but is practically useless against correcting phase distortion.

Another conventional approach employs a matched filter having a transfer function that is the inverse of the transmission media transfer function. This approach acts to neutralize both the amplitude and phase distortion induced by the cable. While this is an effective method for the reduction of ISI, it is impractical because of the multiple signal lines that are utilized with the SCSI communication link. In addition, the SCSI cabling environment must accommodate a wide variety of device configurations making this scheme difficult as well as economically infeasible to provide a single match filter that encompasses all cases.

An apparatus and method is needed, therefore, that can overcome the limitations of conventional approaches, thereby reducing ISI in a variable cable environment and making data detection reliable. Additionally, a need exists such that the implementation of the apparatus and method is relatively easy and cost effective.

DETAILED DESCRIPTION

The following detailed description refers to the accompanying drawings that illustrate embodiments of the present invention. Other embodiments are possible and modifications may be made to the embodiments without departing from the spirit and scope of the invention. Therefore, the following detailed description is not meant to limit the invention. Rather, the scope of the invention is defined by the appended claims.

Furthermore, it will be apparent to one of ordinary skill in the art that the embodiments as described below may be implemented in many different embodiments of software, firmware, and hardware in the entities illustrated in the figures. The actual software code or specialized control hardware used to implement the present invention is not limiting of the present invention. Hence, the operation and behavior of the embodiments will be described without specific reference to the actual software code or specialized hardware components. It is understood that artisans of ordinary skill would be able to design software and control hardware to implement the embodiments of the present invention based on the description herein.

Figure 1:
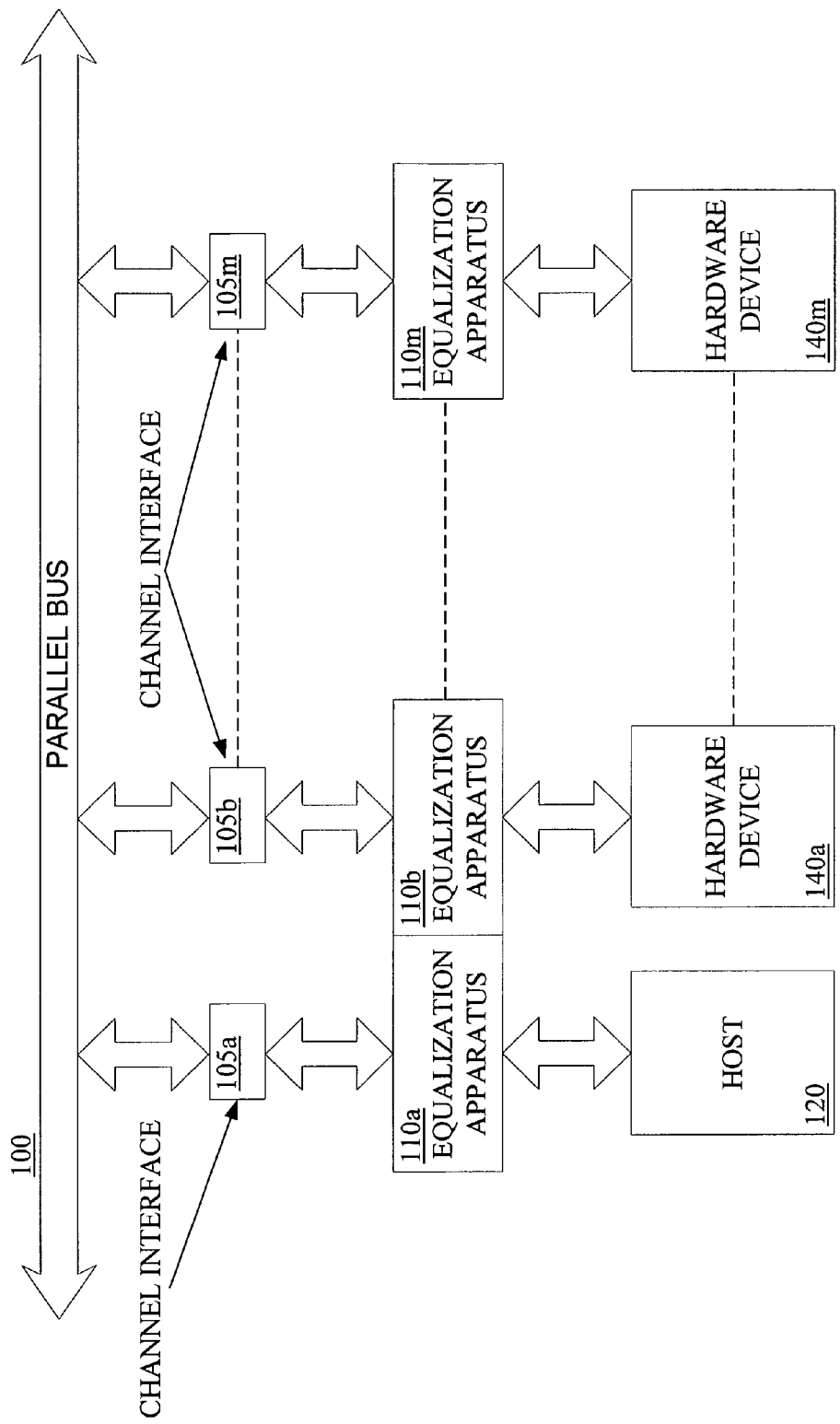
FIG. 1 is a high-level functional block diagram of a host coupled to various hardware devices via a parallel bus and equalization apparatuses.

FIG. 1 shows an overall block diagram of one embodiment of the invention. A host 120 and various hardware devices 140a . . . 140m are coupled to parallel bus 100 via channel interfaces 105a . . . 105m, respectively. The host 120 can be any of a wide variety of central processor units, i.e., Intel Processors, AMD Processors, and the like. Hardware devices 140a . . . 140m include CD ROM record/playback devices, disk drives, scanners, printers, or any other peripheral device designed for communication via parallel bus 100. Channel interfaces 105a . . . 105m facilitate the connection of the individual devices, e.g., host 120 and hardware devices 140a . . . 140m, to the respective lines of parallel bus 100 from whence information, e.g., digital data in the form of an oscillating signal over each line, is received.

Equalization apparatuses 110a . . . 110m reduce the effects of inter-symbol interference (ISI) that is introduced into an oscillating signal as a consequence of various factors including the distance that a signal has to travel on parallel bus 100, the characteristics of the cable that comprises parallel bus 100, and the number of devices coupled to parallel bus 100. Each equalization apparatus has two modes of operation, a training mode and a normal mode.

Figure 2:
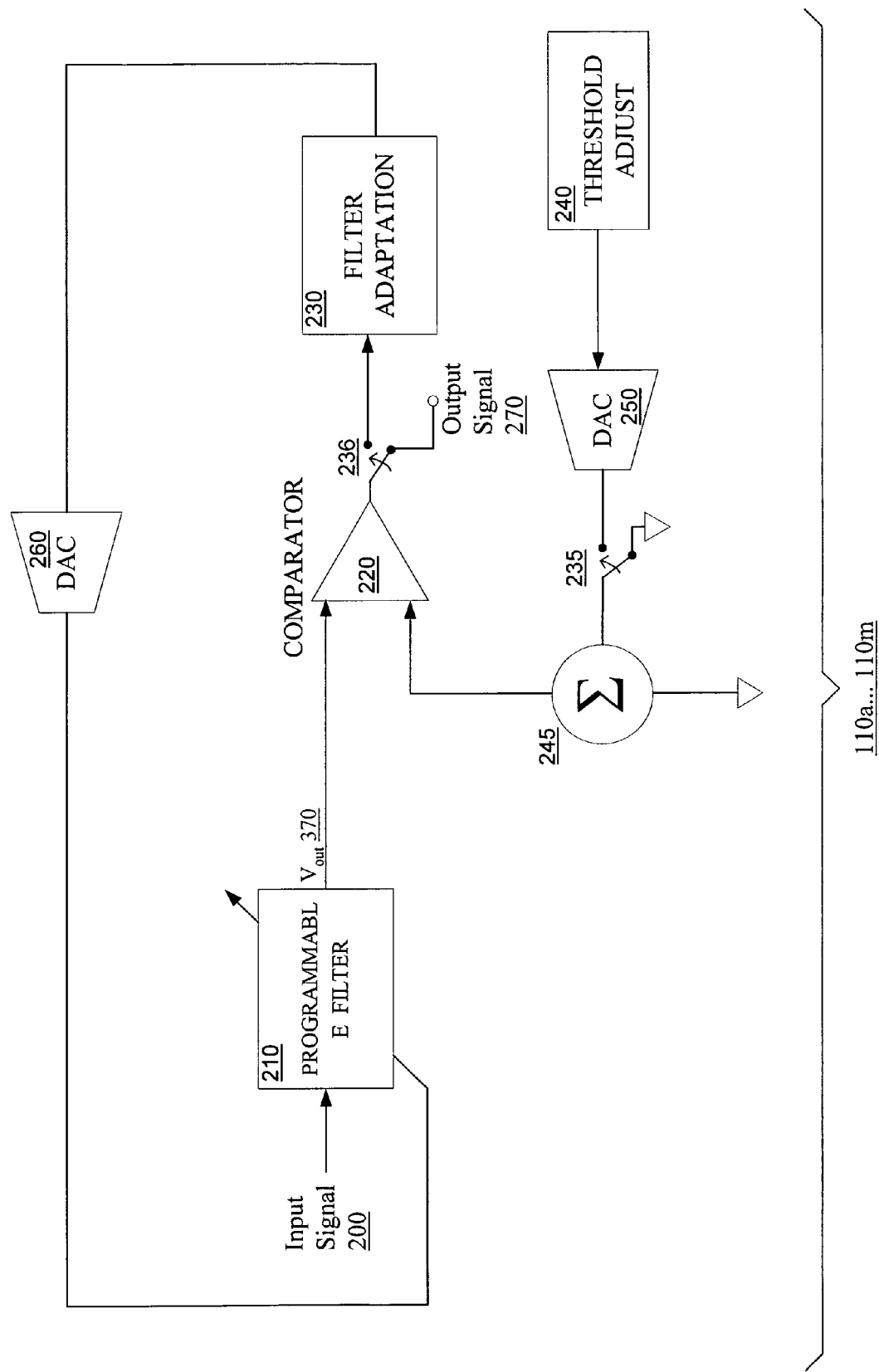
FIG. 2 is a high-level functional block diagram depicting a more specific embodiment of the equalization apparatuses.

FIG. 2 depicts a more detailed representation of an embodiment of the present invention. This high-level block diagram illustrates the functionality of adaptive ISI equalization apparatuses 110a . . . 110m. Each equalization apparatus 110a . . . 110m consists of an adaptive filter element 210, comparator component 220, digital-to-analog converters (DACs) 250 and 260, threshold adjust circuitry 240, filter adaptation circuitry 230, and an adder circuit 245. Switches 235 and 236, shown in the normal mode of operation, are not physically embedded within equalization apparatuses 110a . . . 110m. Rather, they are used for illustrative purposes to aid in the discussion of operation of the invention, as presented below.

In the normal mode of operation, the adaptive filter element 210 receives signals (e.g., input signal 200) transmitted by the host device and outputs signals within a specified frequency range. An externally controlled adjustable gain is incorporated into adaptive filter element 210 for tuning the filter to a predetermined frequency band. The characteristics of adaptive filter element 210 are such that only the high-end frequency components of the received signal within this predetermined frequency band are adjusted. These adjustments are made to the higher frequency components of the received signals because they are more susceptible to ISI effects than lower frequency signals.

Figure 6:
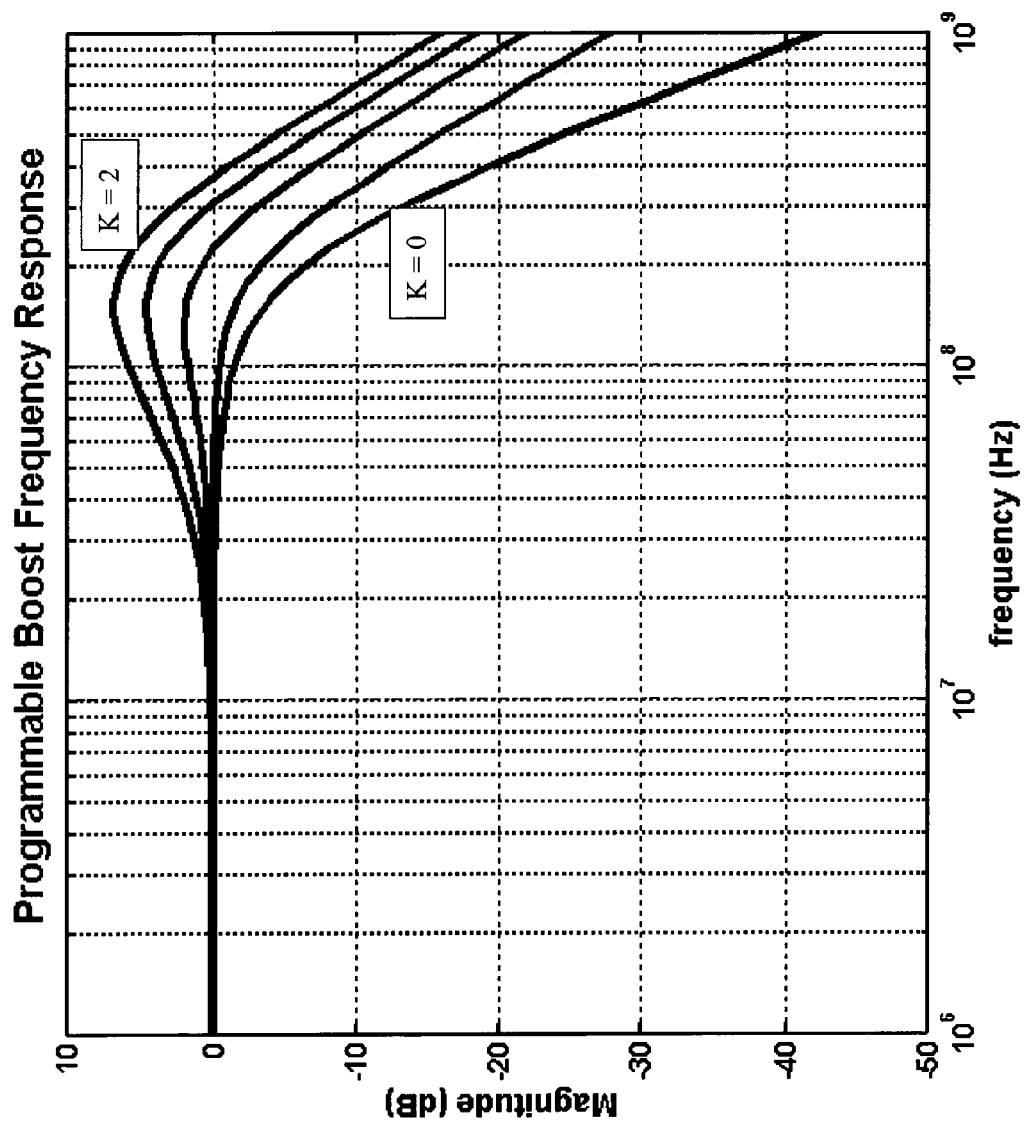
FIG. 6 illustrates the magnitude frequency response of a typical filter with and without a high frequency gain boost.

Adaptive filter element 210 is characterized by the transfer function, (Ks+a)/D(s), where the "Ks" term in the numerator indicates a first order boost with a gain of K. In this implementation, equalization of the received signal is accomplished by adaptive filter element 210 via adjustable gain, K. Such adjustment is controlled by filter adaptation circuitry 230. The magnitude frequency response of a typical filter, with and without a high frequency boost gain, is shown in FIG. 6.

Figure 3:
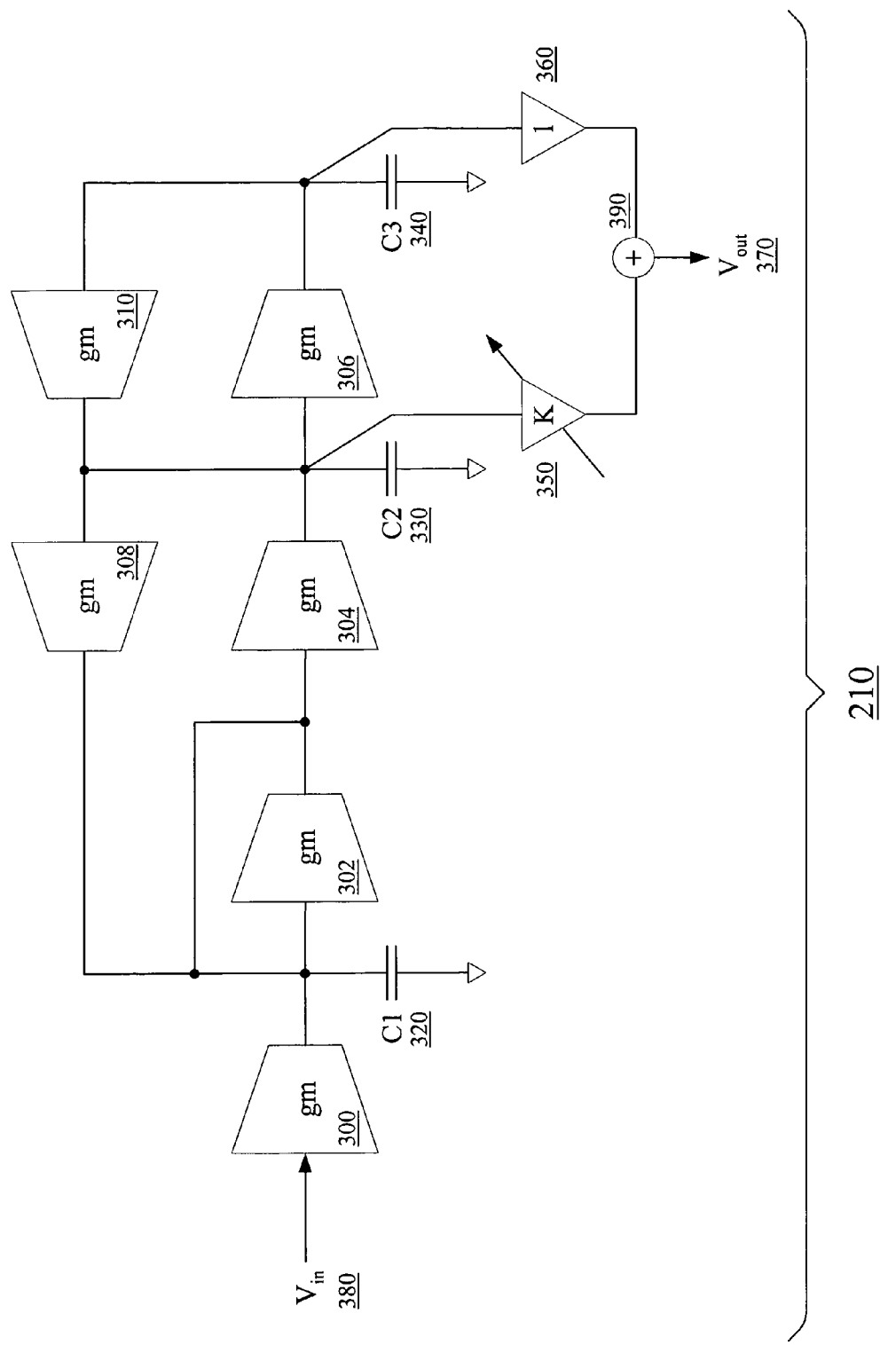
FIG. 3 is a functional block diagram illustrating an implementation of an adaptive filter element.

An embodiment of adaptive filter element 210 utilized by the ISI adaptive equalizer apparatuses 110a . . . 110m is shown in FIG. 3. The filter element 210 is configured as a $3^{rd}$ order Bessel filter with functional components including a multiplicity of transconductance amplifiers 300, 302, . . . 310 with gain gm, and a multiplicity of capacitors C1 320, C2 330, and C3 340. In this embodiment, the input signal $V_{in}$ 380 is applied to transconductance amplifier 300. The voltage on C2 330 provides the $1^{st}$ order term and is amplified by adjustable amplifier 350 with variable gain K. The voltages on capacitors C2 330 and C3 340 are added together to produce the output, $V_{out}$ 370, of the adaptive filter element 210. Output $V_{out}$ 370 can be expressed as:

$$V_{out}=K*V2+V3$$

where V2 and V3 are the voltages on capacitors C2 330 and C3 340, respectively, and K is a value between 0 and 2.

The magnitude of the gain parameter, gm, of transconductance amplifiers 300, 302, . . . 310 controls the bandwidth of the filter and capacitance values C1 320, C2 330, and C3 340 control the location of the filter's poles. Component values of adaptive filter element 210 that provide exceptional response include C1=0.265 pF, C2=0.764 pF, C3=1.326 pF, and gm=800 μA/V.

The preceding discussion focused on the normal mode of operation of equalization apparatuses 110a . . . 110m. Operation of apparatuses 110a . . . 110m in the training mode is accomplished by coupling switches 235 and 236 of FIG. 2 to the threshold adjust circuitry 240 and filter adaptation circuitry 230, respectively. This mode of operation uses a known waveform, i.e., training signal, to calibrate the adaptive filter before pertinent data is sent from host 120 to hardware devices 140a . . . 140m, thereby minimizing ISI effects and allowing for the reliable detection of transmitted information. The training pattern may comprise a pulse train of alternating 1's and 0's, e.g., 1010 . . . , or may be a more complex pseudo-random bit pattern. The waveform used for training each equalization apparatus 110a . . . 110m is inconsequential, provided each apparatus knows a priori the bit pattern corresponding to the training waveform used for calibration.

Figure 4:
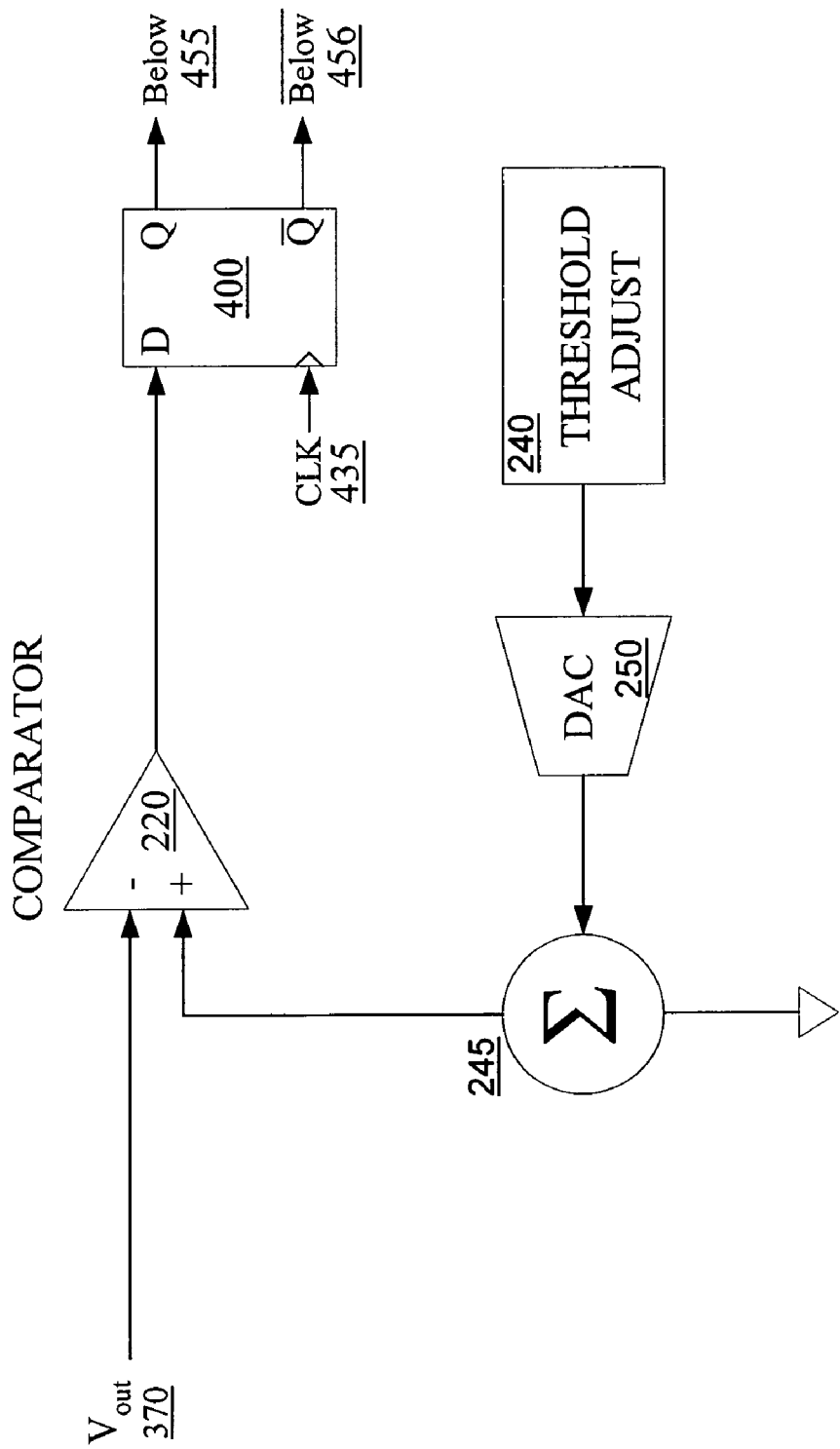
FIG. 4 is a functional block diagram that illustrates the circuit used for comparison of a training waveform to a threshold level. In addition, adjustment of the threshold level is depicted.

During the training mode of operation, before calibration of adaptive filter element 210 can be accomplished, detection of whether or not the training signal is above or below a certain threshold level must be ascertained. FIG. 4 shows a block diagram consisting of a threshold adjust circuit 240 and the components used for signal detection. The output of adaptive filter 210, $V_{out}$ 370, is applied to the inverting input of comparator 220, where it is compared with a threshold value. Comparator 220 outputs a digital logic low if $V_{out}$ 370 is above the threshold value and a digital logic high if $V_{out}$ 370 is below the threshold value. The logic value outputted from comparator 220 is sensed at the input of D flip-flop 400 and is subsequently captured with the rising edge of the synchronous reference clock (CLK) 435. The outputs of D flip-flop 400, Below 455 and Belownot 456, are then used by filter adaptation circuitry 230 to adjust the boost gain, K, of adaptive filter element 210.

The threshold value is set by threshold adjust circuit 240 at the beginning of the pulse train that comprises the signal used in the training mode of operation. A DC level corresponding to the highest negative peak amplitude a data signal can obtain is transmitted by host 120 to equalization apparatuses 110a . . . 110m. The threshold value is then fine tuned via adder circuitry 245 until a transition in the output of comparator 220 is sensed, at which time threshold adjustment ceases. All subsequent transmissions from host 120 are compared against this threshold value. It should be noted that in a related embodiment of the invention, a DC level corresponding to the highest positive peak could just as well have been used with a reversal in comparator 220 inputs and a positive threshold value.

Figure 5:
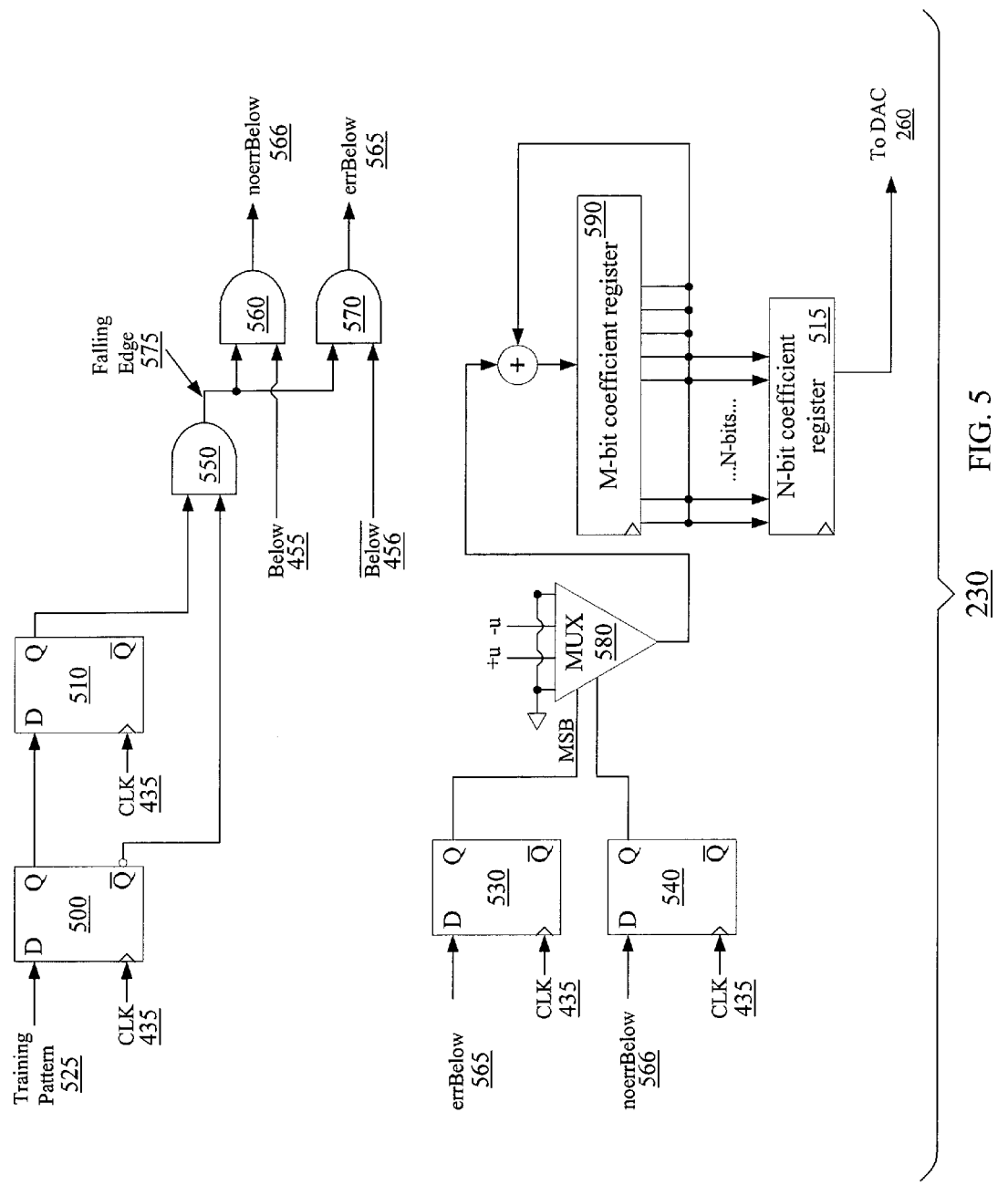
FIG. 5 is a high-level functional block diagram depicting an embodiment of filter adaptation circuitry.
Figure 7:
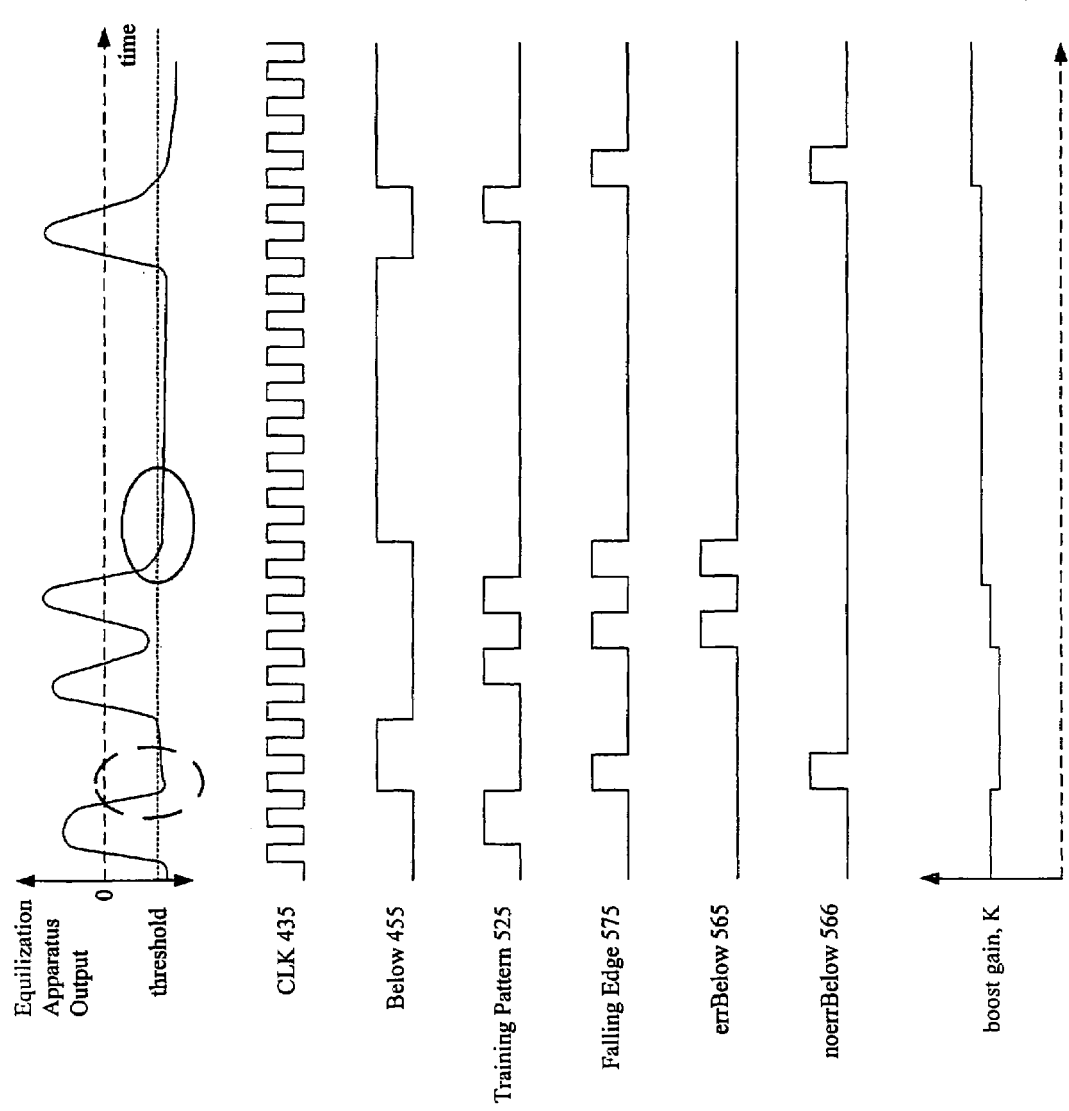
FIG. 7 illustrates the relationship of signals used for filter adaptation to an input waveform and the results these have on the boost gain.

A high-level schematic of filter adaptation circuitry 230 is shown in FIG. 5. Once the threshold level has been set by threshold adjust circuitry 240, filter adaptation is accomplished using the waveform of training pattern 525. As noted earlier, the data bit pattern corresponding to the training waveform as to when in time transitions occur must be known by equalization apparatuses 110a . . . 110m before filter adaptation takes place. As depicted in FIG. 5, training pattern 525 is captured by D flip-flop 500 and subsequently by D flip-flop 510 using CLK 435. D flip-flops 500 and 510 are used in conjunction with AND gate 550 to detect a falling edge in the training waveform. The output signal, Falling Edge 575, of AND gate 550, is inputted into AND gates 560 and 570 along with logic signals Below 455 and Belownot 456, with Below 455 being input to AND gate 560 and Belownot 456 being input to AND gate 570, to generate logic signals errBelow 565 and noerrBelow 566. The signals errBelow 565 and noerrBelow 566 are subsequently captured by D flip-flops 530 and 540, respectively, and are then used as select lines for multiplexer (MUX) 580. The logic levels of errBelow 565 and noerrBelow 566 determine whether or not the boost gain, K, of adaptive filter element 210, should be increased or decreased. In this embodiment of the invention, if errBelow 565 is logic high and noerrBelow 566 is logic low, K will be increased by a programmable value, u, which controls the rate of adaptation. If, on the other hand, noerrBelow 566 is logic high and errBelow 565 is logic low, then K will be decreased by the amount u. If the signals, 565 and 566, are either high or low simultaneously, then the boost gain, K, remains constant. In this way, the boost gain, K, of adaptive filter element 210 is adjusted so that the amplitude of the filtered high frequency signal matches the negative DC reference voltage. The M-bit coefficient register 590 and N-bit coefficient register 515 are used to store and program the boost signal gain, K. FIG. 7 illustrates with a timing diagram the relationship of the signals, generated in FIGS. 4 and 5, to the input waveform as well as the result on the boost signal gain, K.

Figure 8:
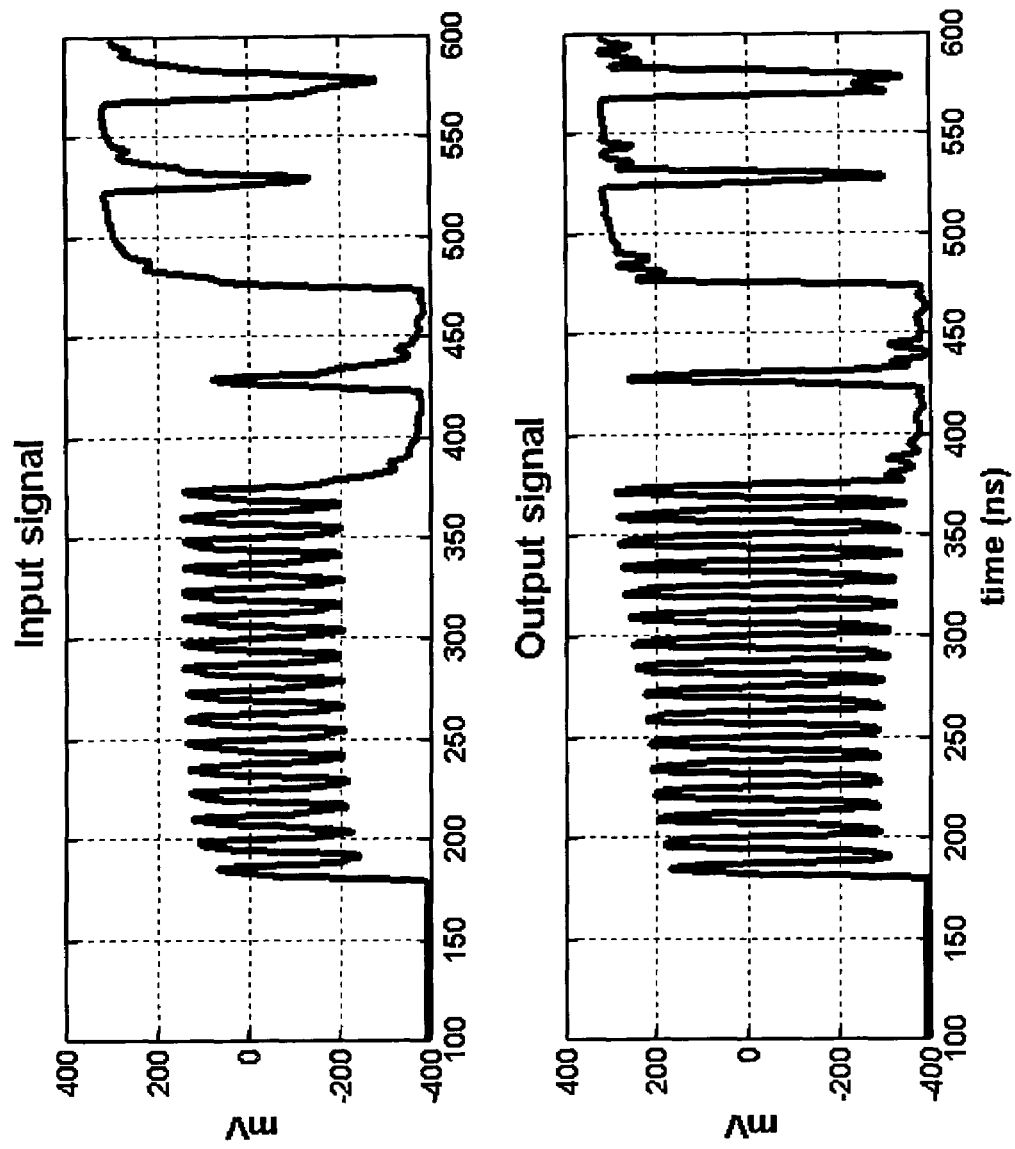
FIG. 8 depicts the transient response of an unequalized signal and an adaptively equalized signal.

FIG. 8 shows the transient response of an unequalized signal, e.g., Input Signal 200, (top waveform) and an adaptively equalized signal, e.g., Output Signal 270, (bottom waveform) as processed by the present invention. As stated previously, two modes of operation are employed by equalization apparatuses 110a . . . 110m. Each apparatus 110a . . . 110m is in training mode between 0 and 500 ns. Between 0 and 50 ns, the host asserts a DC voltage level of −200 mV in order to set the threshold level; between 50 ns and 500 ns, the host device transmits the high frequency training pattern '101010 . . . '; and after 500 ns the equalization apparatuses 110a . . . 110m are placed in the normal mode of operation and digital information-bearing signals are transmitted by host 120. It is to be noted that adaptive equalization is accomplished during the first 300 ns of the training pattern.

Referring to the unequalized signal, it can be seen that the negative peak amplitude of the high frequency transmission signal is approximately −100 mV or half of the asserted DC voltage level. During the transmission of data signals, amplitudes of consecutive negative and positive peaks can vary by as much as 100 mV.

For the equalized signal beyond ~160 ns, the negative peak amplitude of the high frequency transmission signal is boosted so that it consistently approximates the threshold level that was determined at the beginning of the training pulse, i.e., the DC voltage level of −200 mV. The subsequent information-bearing signals are equalized in the manner explained previously, as is depicted by the output (equalized) signal in FIG. 8.

Thus, by equalizing the high frequency components, the amplitudes of the information-bearing signals become relatively constant and ISI effects are minimized. The success of adaptive equalization apparatuses 110a . . . 110m make them attractive for use in high-speed data transfer variable SCSI cabling environments.

It is important to note that the foregoing description of embodiments of the present invention provides illustration and description, but is not intended to be exhaustive or to limit the invention to the precise form disclosed. Modifications and variations are possible consistent with the above teachings or may be acquired from practice of the invention. The claims and their equivalents define the scope of the invention.

What is claimed is:

1. A circuit for adaptively amplifying an input signal, the circuit comprising:
    an adaptive filter connected to receive the input signal and to amplify a predetermined frequency range of the input signal by an amount based on an amplification control signal input to the adaptive filter to generate an amplified input signal;
    a comparator connected to receive the amplified input signal from the adaptive filter and a predetermined threshold signal, the comparator outputting a comparison signal based on a comparison of the amplified input signal to the predetermined threshold signal; and
    a filter adaptation circuit connected to receive the comparison signal and to modify the amplification control signal based on the comparison signal and a known training pattern,
    wherein the filter adaptation circuit comprises:
    a first circuit connected to receive the comparison signal, the known training pattern, and a system clock signal, the first circuit converting the comparison signal, the known training pattern, and the system clock signal into a first output signal that is asserted on a falling edge of the known training pattern when the comparison signal indicates that the input signal is above a level of the predetermined threshold signal and a second output signal that is asserted on the falling edge of the known training pattern when the comparison signal indicates that the input signal is below the level of the predetermined threshold signal; and
    a second circuit connected to receive the first and second output signals and to increase the amplification control signal when the first output signal is asserted and the second output signal is not asserted and to decrease the amplification control signal when the first output signal is not asserted and the second output signal is asserted.

2. The circuit of claim 1, wherein the input signal is a SCSI (small computer system interface) signal and the adaptive filter is configured to reduce inter-symbol interference (ISI) in the SCSI signal based on the amplification control signal.

3. The circuit of claim 1, wherein the predetermined frequency range amplified by the adaptive filter consists of high frequency components of the input signal.

4. The circuit of claim 1, wherein the adaptive filter is a third order Bessel filter.

5. The circuit of claim 1, wherein the comparison signal indicates whether the amplified input signal is greater than the predetermined threshold signal.

6. The circuit of claim 1, further comprising a digital-to-analog converter connected between the adaptive filter and the filter adaptation circuit, the digital-to-analog converter converting a digital version of the amplification control signal output from the filter adaptation circuit to an analog version of the amplification control signal for input to the adaptive filter.

7. A method for adaptively amplifying an input signal, the method comprising:

amplifying a predetermined frequency range of the input signal by an amount based on an amplification control signal to generate an amplified input signal;

comparing the amplified input signal with a predetermined threshold level to generate a comparison signal;

converting the comparison signal, a known training pattern, and a system clock signal into a first output signal that is asserted on a falling edge of the known training pattern when the comparison signal indicates that the input signal is above the predetermined threshold level and a second output signal that is asserted on the falling edge of the known training pattern when the comparison signal indicates that the input signal is below the predetermined threshold level;

increasing the amplification control signal when the first output signal is asserted and the second output signal is not asserted; and decreasing the amplification control signal when the first output signal is not asserted and the second output signal is asserted.

8. The method of claim 7, wherein the input signal is a SCSI (small computer system interface) signal and wherein amplifying the predetermined frequency range of the input signal by the amount based on the amplification control signal comprises reducing inter-symbol interference (ISI) in the SCSI signal based on the amplification control signal.

9. The method of claim 7, wherein amplifying the predetermined frequency range of the input signal by the amount based on the amplification control signal comprises amplifying high frequency components of the input signal.

10. The method of claim 7, wherein amplifying the predetermined frequency range of the input signal by the amount based on the amplification control signal comprises carrying out a third order Bessel filter on the input signal based on the amplification control signal.

* * * * *